(12) United States Patent
Balakrishnan et al.

(10) Patent No.: US 10,002,924 B2
(45) Date of Patent: Jun. 19, 2018

(54) DEVICES INCLUDING HIGH PERCENTAGE SIGE FINS FORMED AT A TIGHT PITCH AND METHODS OF MANUFACTURING SAME

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 14/827,514

(22) Filed: Aug. 17, 2015

(65) Prior Publication Data
US 2017/0053985 A1  Feb. 23, 2017

(51) Int. Cl.
| | | |
|---|---|---|
| H01L 29/10 | (2006.01) | |
| H01L 29/78 | (2006.01) | |
| H01L 29/06 | (2006.01) | |
| H01L 29/66 | (2006.01) | |
| H01L 29/161 | (2006.01) | |

(52) U.S. Cl.
CPC ...... *H01L 29/1054* (2013.01); *H01L 29/0692* (2013.01); *H01L 29/161* (2013.01); *H01L 29/6681* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,048,723 B2 | 11/2011 | Chang et al. | |
| 8,211,772 B2 | 7/2012 | Kavalieros et al. | |
| 8,497,177 B1* | 7/2013 | Chang | H01L 29/66795 438/283 |
| 8,853,019 B1 | 10/2014 | Fronheiser et al. | |
| 8,895,381 B1* | 11/2014 | Cheng | H01L 21/84 257/E21.409 |
| 2007/0231997 A1* | 10/2007 | Doyle | H01L 29/66818 438/253 |
| 2012/0025313 A1 | 2/2012 | Chang et al. | |
| 2012/0241818 A1 | 9/2012 | Kavalieros et al. | |

(Continued)

*Primary Examiner* — Samuel Gebremariam
*Assistant Examiner* — Jonas T Beardsley
(74) *Attorney, Agent, or Firm* — Louis J. Percello; Ryan, Mason & Lewis, LLP

(57) ABSTRACT

A method for manufacturing a semiconductor device comprises forming a plurality of silicon fins on a substrate, wherein the plurality of silicon fins are spaced apart from each other at a pitch and formed to a height in a direction perpendicular to a top surface of the substrate, forming a nitride layer between each of adjacent silicon fins and on lateral surfaces of each of the silicon fins, removing a portion of each of the silicon fins to reduce the height of the silicon fins, epitaxially growing a silicon germanium (SiGe) layer on the remaining portion of each of the silicon fins, performing a top-down condensation process on the epitaxially grown SiGe layers to form an oxide layer and an SiGe fin under the oxide layer in place of each epitaxially grown SiGe layer and the remaining portion of each silicon fin, and removing the oxide layers and nitride layers.

20 Claims, 2 Drawing Sheets

(56) References Cited

U.S. PATENT DOCUMENTS

2014/0030876 A1    1/2014  Flachowsky et al.
2014/0084370 A1    3/2014  Cappellani et al.
2014/0170839 A1*   6/2014  Brunco ............. H01L 29/66795
                                                            438/479
2015/0091099 A1*   4/2015  Ching ............. H01L 21/823431
                                                            257/401

* cited by examiner

DEVICES INCLUDING HIGH PERCENTAGE SIGE FINS FORMED AT A TIGHT PITCH AND METHODS OF MANUFACTURING SAME

TECHNICAL FIELD

The field generally relates to semiconductor devices including silicon germanium (SiGe) fins and methods of manufacturing same and, in particular, to high percentage silicon germanium (SiGe) fins formed at a tight pitch.

BACKGROUND

Known methods of three-dimensional (3D) condensation to form SiGe fins with high percentage germanium do not allow for formation of these fins with a tight fin pitch, such as, for example, a fin pitch of 27 nm for 7 nm technology. For example, known methods of 3D condensation to produce high percentage germanium SiGe fins result in too much lateral reduction in the sizes of fins, and there is not sufficient substrate space to print fins that are thick enough prior to condensation to result in tight fin pitches. In addition, fin shapes are undesirably altered during 3D condensation of relatively tall fins.

Critical thickness limitations also prevent an overall starting thickness for an initial fin before condensation from being too thick, and prevent growing of high percentage germanium SiGe fins as a thick block and cutting of the fins at a tight pitch out of the block. A critical thickness is the thickness at which strain energy (e.g., compressive strain) becomes too large to maintain local equilibrium between mismatched lattice structures of two materials (e.g., silicon layer and SiGe on the silicon layer). Once the critical thickness is reached or is exceeded, the strain is relaxed through misfit dislocation formation. For example, strain in a SiGe layer on silicon will be relaxed upon reaching the critical thickness. The relaxed unstrained state of SiGe (e.g., a resulting SiGe fin) degrades performance of a field-effect transistor (FET), which can benefit from compressive strain. As an example, a critical thickness of 85 atomic percent germanium SiGe is less than 15 nm. A starting thickness of a fin to produce, for example 85 atomic percent germanium SiGe would have to be greater than 15 nm to produce fins at a desired tight pitch, and a desired height. Moreover, subsequent cutting of a block can also relax compressive strain near a location where a cut is made.

SUMMARY

According to an exemplary embodiment of the present invention, a method for manufacturing a semiconductor device comprises forming a plurality of sacrificial fins on a substrate, wherein the plurality of sacrificial fins are spaced apart from each other at a pitch and formed to a height in a direction perpendicular to a top surface of the substrate, forming an insulating layer between each of adjacent sacrificial fins and on lateral surfaces of each of the sacrificial fins, removing a portion of each of the sacrificial fins to reduce the height of the sacrificial fins, epitaxially growing a silicon germanium (SiGe) layer on the remaining portion of each of the sacrificial fins, performing a top-down condensation process on the epitaxially grown SiGe layers to form an oxide layer and an SiGe fin under the oxide layer in place of each epitaxially grown SiGe layer and the remaining portion of each sacrificial fin, and removing the oxide layers and insulating layers.

According to an exemplary embodiment of the present invention, a method for manufacturing a semiconductor device comprises forming a plurality of silicon fins on a substrate, wherein the plurality of silicon fins are spaced apart from each other at a pitch and formed to a height in a direction perpendicular to a top surface of the substrate, forming a nitride layer between each of adjacent silicon fins and on lateral surfaces of each of the silicon fins, removing a portion of each of the silicon fins to reduce the height of the silicon fins, epitaxially growing a silicon germanium (SiGe) layer on the remaining portion of each of the silicon fins, performing a top-down condensation process on the epitaxially grown SiGe layers to form an oxide layer and an SiGe fin under the oxide layer in place of each epitaxially grown SiGe layer and the remaining portion of each silicon fin, and removing the oxide layers and nitride layers.

According to an exemplary embodiment of the present invention, a semiconductor device comprises a substrate, and a plurality of silicon germanium (SiGe) fins on the substrate, wherein the plurality of SiGe fins are spaced apart from each other at a pitch of about 35 nm or less, wherein a percentage of germanium in each SiGe fin is greater than or equal to 50 atomic percent, and wherein each SiGe fin has a height of about 30 nm to about 60 nm in a direction perpendicular to a top surface of the substrate.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to semiconductor devices, for example, fin field-effect transistor (FinFET) devices including silicon germanium (SiGe) fins having a high germanium concentration, a relatively tall height, and formed at a tight pitch. The embodiments of the present invention utilize top down condensation to address the issues of strain and critical thickness to produce tall, strained and high percentage germanium SiGe fins at very tight pitches. This invention may, however, be embodied in many different forms and should not be construed as limited to the embodiments set forth herein.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of embodiments of the invention provided herein, one of ordinary skill in the art will be able to contemplate other implementations and applications of embodiments of the invention.

Figure 1:
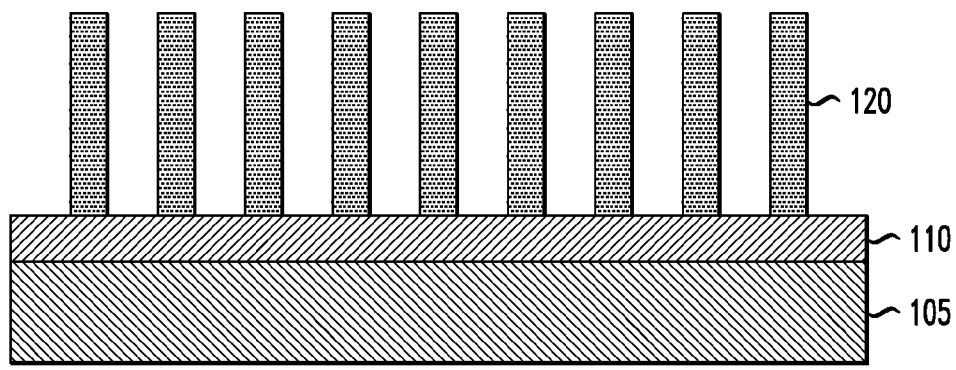
FIG. 1 is a cross-sectional view of a semiconductor substrate including a buried insulating layer and a plurality of sacrificial fins thereon, according to an exemplary embodiment of the present invention.

FIG. 1 is a cross-sectional view of a semiconductor substrate 105 including a buried insulating layer 110 and a plurality of sacrificial fins 120 thereon, according to an exemplary embodiment of the present invention. The substrate 105 may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the substrate.

As used herein, "pitch" or "fin pitch" refers to a distance between adjacent fins of a FinFET device, for example, the distance measured from a center of one fin to a center of an adjacent fin.

As used herein, "height" refers to a vertical length of an element (e.g., a fin, layer, etc.) in the figures measured from a bottom surface to a top surface of the element, and/or measured with respect to a surface on which the element is directly on.

As used herein, a "lateral surface" refers to a left or right side surface of an element (e.g., a fin, layer, etc.) in the figures.

Referring to FIG. 1, the semiconductor substrate 105, can be, for example, a silicon-on-insulator (SOI) substrate, where a buried insulating layer 110, such as, for example, a buried oxide or nitride layer, is located on an upper surface of the semiconductor substrate 105. In accordance with an embodiment of the present invention, a plurality of silicon sacrificial fins 120, are formed by patterning a silicon layer (or a top portion of a bulk substrate if one is used) into the fins. Patterning is performed by a method known in the art, for example, sidewall image transfer and etching. In accordance with an embodiment of the present invention, each fin 120 is patterned to be relatively taller than fins formed in conventional patterning processes to be, for example, with a top surface about 60 nm to about 200 nm above the buried insulating layer 110. By way of non-limiting example, each fin can be patterned to a height of about 120 nm above the buried insulating layer. The silicon fins 120 are formed at a predetermined tight pitch, for example at a pitch of 35 nm or less.

Figure 2:
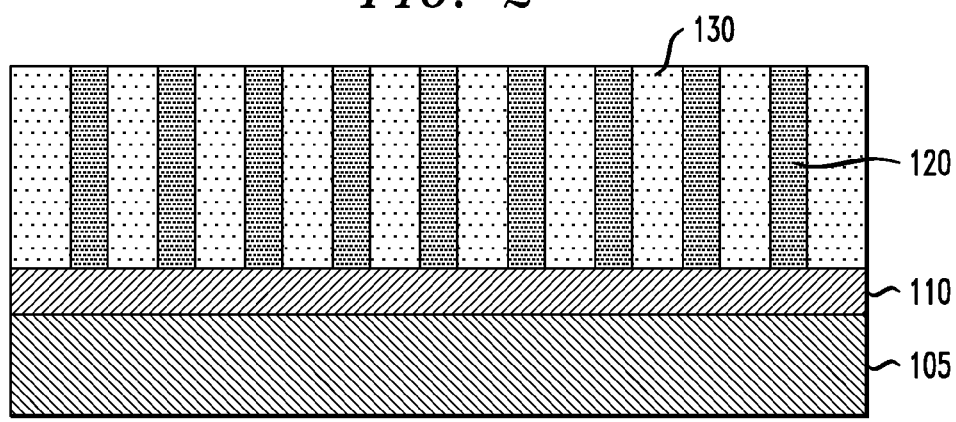
FIG. 2 is a cross-sectional view illustrating formation of nitride layers in a method of manufacturing a semiconductor device, according to an embodiment of the present invention.

FIG. 2 is a cross-sectional view illustrating formation of nitride layers in a method of manufacturing a semiconductor device, according to an embodiment of the present invention. Referring to FIG. 2, nitride layers 130, comprising, for example, silicon nitride (SiN), are deposited to fill in the spaces between the sacrificial fins 120 using, for example, any suitable deposition technique known in the art, including, but not limited to, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD). If necessary, after deposition of the nitride layers 130, the resulting structure can be planarized by an appropriate planarization process, such as, for example, chemical mechanical planarization (CMP). Referring to FIG. 2 the nitride layers are formed between each of adjacent sacrificial fins 120 and on lateral surfaces of each of the sacrificial fins 120.

Figure 3:
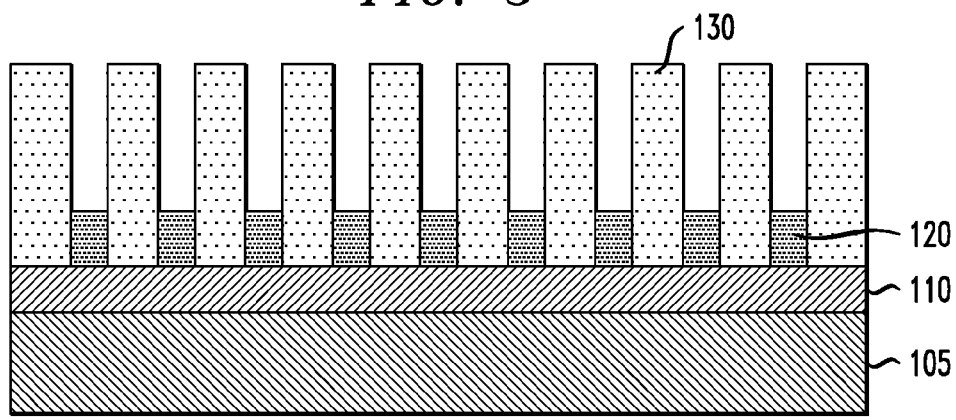
FIG. 3 is a cross-sectional view illustrating removal of part of the sacrificial fins in a method of manufacturing a semiconductor device, according to an exemplary embodiment of the invention.

FIG. 3 is a cross-sectional view illustrating removal of part of the sacrificial fins in a method of manufacturing a semiconductor device, according to an exemplary embodiment of the invention. Referring to FIG. 3, the plurality of sacrificial fins 120 are recessed to a shorter height, for example, to a height where a top surface of each fin 120 is about 5 nm to about 10 nm above the buried insulating layer 110. For the 120 nm example given above, the fins 120 are recessed by about 110 nm to 115 nm to result in the top surface about 5 nm to about 10 nm above the buried insulating layer 110. According to an embodiment, the sacrificial fins 120 are selectively etched with respect to the nitride layers 130 using an isotropic etching process, such as reactive ion etching (RIE).

Figure 4:
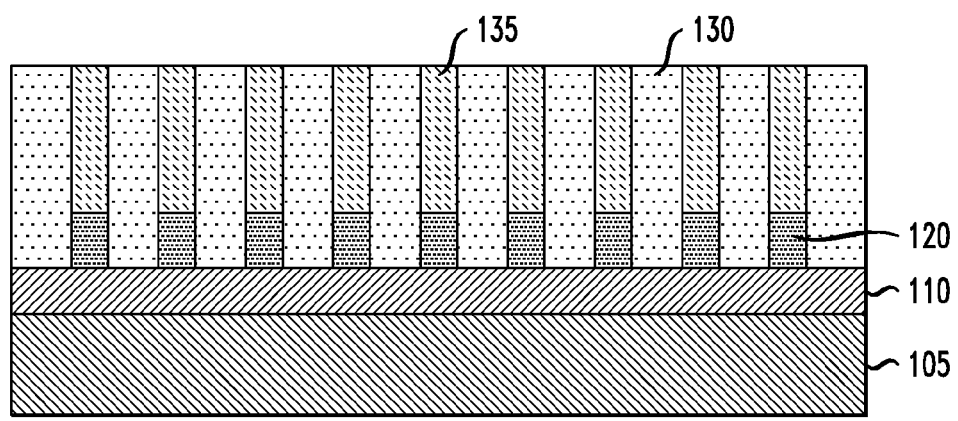
FIG. 4 is a cross-sectional view illustrating epitaxial growth of SiGe in a method of manufacturing a semiconductor device, according to an exemplary embodiment of the invention.

FIG. 4 is a cross-sectional view illustrating epitaxial growth of silicon germanium (SiGe) in a method of manufacturing a semiconductor device, according to an exemplary embodiment of the invention. Referring to FIG. 4, with the remaining sacrificial silicon fins 120 functioning as seed layers, SiGe fin layers 135 are epitaxially grown on the remaining silicon fins 120 between the nitride layers 130.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the SiGe fin layers 135. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

According to an embodiment, the SiGe fin layers 135 can each have between a concentration of 10 atomic percent to 50 atomic percent, for example, in connection with an illustrative embodiment described herein, 30 atomic percent germanium concentration. Epitaxial growth is stopped once the SiGe reaches the top surfaces of the nitride layers 130. Therefore, in keeping with the numerical example of 120 nm tall fins, approximately 110 nm of SiGe is epitaxially grown on the sacrificial silicon fins 120. If necessary, due to overfill of the SiGe fin layers 135, after epitaxial growth of the SiGe fin layers 135, the resulting structure can be planarized by an appropriate planarization process, such as, for example, CMP, in order to planarize the top surfaces of the SiGe fin layers 135 to be level with the top surfaces of the nitride layers 130. According to an embodiment, overfilling and subsequent CMP of the SiGe may be performed instead of a target flush fill of the SiGe to the height of the nitride layers 130, which is can be difficult to uniformly accomplish across a wafer.

Figure 5:
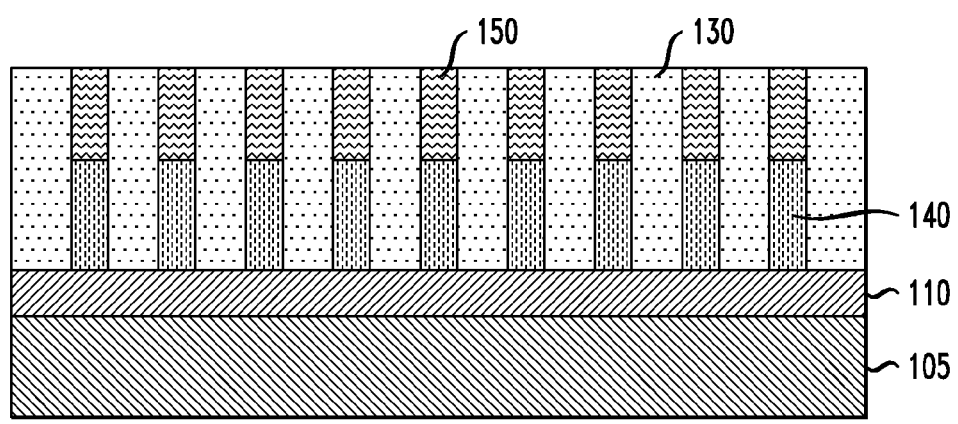
FIG. 5 is a cross-sectional view illustrating thermal condensation in a method of manufacturing a semiconductor device, according to an exemplary embodiment of the invention.

FIG. 5 is a cross-sectional view illustrating thermal condensation in a method of manufacturing a semiconductor device, according to an exemplary embodiment of the invention. Referring to FIG. 5, thermal condensation is performed on the structure of FIG. 4 to result in the structure shown in FIG. 5. During the thermal condensation process, oxygen is only provided from the top since the nitride layers 130 cover the sides of the SiGe and silicon layers 135, 120 and, thereby, prevent lateral oxidation (i.e., in the left-right direction in the figures). Referring to FIG. 4, according to an embodiment of the present invention, during the thermal condensation process, the SiGe layers 135 are oxidized from their top surfaces and the silicon from the exposed surfaces of the SiGe layers 135 is consumed, and forms an oxide 150, such as silicon dioxide ($SiO_2$) (see FIG. 5) in place of a top portion of each of the SiGe layers 135, thereby condensing what will be the resulting the fin structures from top portions thereof, as can be seen by the reduced height of the resulting SiGe fins 140 in FIG. 6. By way of further explanation, in accordance with an embodiment of the present invention, referring to FIG. 4, silicon atoms in the top portions of the SiGe layers 135 bond with oxygen that is available during the condensation process and an oxide 150 (e.g., $SiO_2$). As a result, because preferably silicon bonds with the oxygen and not germanium, the germanium from the oxidized portions of the epitaxially grown SiGe 135 is driven down by diffusion into the remaining portions of the SiGe layers 135 that have not been oxidized, and into the remaining silicon layers 120 to result in the SiGe fins 140. In other words, during the thermal condensation process, germanium migrates downwards into the remaining portions of the SiGe layers 135 that have not been oxidized, and into remaining silicon layers 120 and converts the remaining silicon layers 120 into a SiGe material portion. In accordance with an embodiment of the present invention, due to the germanium enrichment from the thermal condensation process, the SiGe fins 140 have a germanium concentration in each fin 140 that is higher than what the germanium concentration was in each of the SiGe layers 135 before the thermal condensation process.

The condensation is the result of thermal oxidation that is performed at a temperature sufficient enough to cause oxidation of the silicon in the epitaxial SiGe 135. In one embodiment of the present invention, the thermal oxidation is performed at a temperature from about 700° C. to about 1300° C. In another embodiment of the present invention, the thermal oxidation is performed at a temperature from about 1000° C. to about 1200° C.

In accordance with an embodiment of the present invention, the thermal oxidation is performed in an oxidizing ambient which includes at least one oxygen-containing gas such as, for example, $O_2$, NO, $N_2O$, ozone, air and other like oxygen-containing gases. The oxygen-containing gases may be admixed with each other (such as an admixture of $O_2$ and NO), or the gas may be diluted with an inert gas such as, for example, He, Ar, $N_2$, Xe, Kr, or Ne.

In accordance with an embodiment of the present invention, the thermal oxidation may be carried out for a variable period of time. In one example, the thermal oxidation is carried out for a time period from about 5 seconds to about 5 hours, depending on thermal oxidation temperature and oxidation species. In another embodiment, the thermal oxidation may be carried out for a time period from about 5 minutes to about 30 minutes. The thermal oxidation may be carried out at a single targeted temperature, or various ramp and soak cycles using various ramp rates and soak times can be employed.

As noted above, during the thermal condensation process, oxygen is only provided from the top since the nitride layers 130 cover the sides of the SiGe and silicon layers 135, 120. As a result, the original width and pitch, or close to the original width and pitch of the sacrificial fins 120 can be maintained in the resulting fins 140. According to an embodiment of the present invention, the final height and SiGe concentration of the fins 140 is determined by thicknesses (left to right direction in the figures) of the silicon and SiGe layers 120, 135 since smaller or larger thicknesses result in smaller or larger portions of the SiGe layers 135 being oxidized, and smaller or larger portions of the SiGe and silicon layers 135, 120 receiving Ge.

According to an embodiment, the thermal condensation process is performed until the resulting SiGe fins 140 having a desired height and germanium concentration are formed. Alternatively, according to an embodiment, to accelerate the top-down condensation process, during the formation of the SiGe fins 140, prior to reaching the desired height and germanium concentration, intermediate formed oxide 150 (e.g., oxide 150 formed up to a particular point in time) can be stripped by, for example, aqueous hydrofluoric acid etch, and after the stripping, a subsequent top-down thermal condensation can be performed. This process of condensing, stripping and condensing again can be repeated until the resulting SiGe fins 140 having a desired height and germanium concentration are formed.

Figure 6:
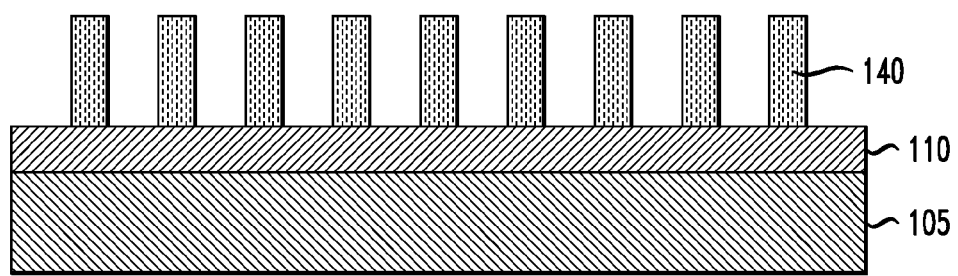
FIG. 6 is a cross-sectional view illustrating the resulting fins after removal of oxide and nitride layers in a method of manufacturing a semiconductor device, according to an exemplary embodiment of the invention.

FIG. 6 is a cross-sectional view illustrating the resulting fins after removal of oxide and nitride layers in a method of manufacturing a semiconductor device, according to an exemplary embodiment of the invention. Referring to FIG. 6, once the final SiGe fins 140 having a desired height and germanium concentration are formed on the buried insulating layer 110 by a thermal condensation process, the oxide 150 and nitride layers 130 are removed to result in the structure shown in FIG. 6. The oxide layers 150 are removed by, for example, aqueous hydrofluoric acid etch as noted above, and then, after removing the oxide layers, the nitride layers 130 are removed by, for example, aqueous hot phosphoric acid etch.

In connection with the working example of the 120 nm starting height of the silicon fins 120, the resulting SiGe fins 140 can be, for example, (1) about 50 nm tall (height above the buried insulating layer 110) with 66 atomic percent germanium concentration in the SiGe fin 140; (2) about 40 nm tall with 75 atomic percent germanium concentration in the SiGe fin 140; (3) about 36 nm tall with 90 atomic percent germanium concentration in the SiGe fin 140; or (4) about 33 nm tall pure germanium fins 140. As can be understood, more oxidation, for example, due to a longer oxidation process, results in shorter SiGe fins with a higher percentage of Ge. According to embodiments of the present invention, a percentage of germanium in each SiGe fin 140 can greater than or equal to 50 atomic percent, and each SiGe fin 140 can have a height of about 30 nm to about 60 nm.

In accordance with the embodiments of the present invention, any compressive strain of the resulting SiGe fins 140 due to mismatched lattice structures between SiGe and silicon is maintained because a thickness (left-right in the figures) of the high percentage germanium SiGe fins does not exceeds a critical thickness for the SiGe fin having a particular germanium concentration. Further, as there is no cutting of a block into fins, there is no loss of compressive strain due to cutting. As a result, the SiGe fin 140 is not relaxed and is maintained in a strained state.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a plurality of sacrificial fins on a substrate, wherein the plurality of sacrificial fins are spaced apart from each other at a pitch and formed to a height in a direction perpendicular to a top surface of the substrate and to a width in a direction parallel to the top surface of the substrate;
    forming a first insulating layer between each of adjacent sacrificial fins and on lateral surfaces of each of the sacrificial fins;
    removing a portion of each of the sacrificial fins to reduce the height of the sacrificial fins to form a plurality of cavities in the first insulating layer that are each partially filled with the remaining portion of each of the sacrificial fins, respectively;
    epitaxially growing a silicon germanium (SiGe) layer on the remaining portion of each of the sacrificial fins in each of the plurality of cavities;
    performing a top-down condensation process on the epitaxially grown SiGe layers to form an oxide layer and an SiGe fin under the oxide layer in place of each epitaxially grown SiGe layer and the remaining portion of each sacrificial fin;
    wherein a width of each oxide layer and a width of the SiGe fin under each oxide layer are at least substantially the same as the width of the sacrificial fins, and each oxide layer is respectively located on a top surface of a corresponding SiGe fin without extending onto lateral surfaces of the corresponding SiGe fin; and
    removing each oxide layer and the first insulating layer after performing the top-down condensation process;
    wherein a second insulating layer is positioned between the SiGe fins and the substrate; and
    wherein the first insulating layer is removed down to a top surface of the second insulating layer.

2. The method of claim 1, wherein the pitch is about 35 nm or less.

3. The method of claim 2, wherein a percentage of germanium in each SiGe fin is greater than or equal to 50 atomic percent.

4. The method of claim 3, wherein each SiGe fin has a height of about 30 nm to about 60 nm in the direction perpendicular to the top surface of the substrate.

5. The method of claim 3, wherein each SiGe fin is compressively strained.

6. The method of claim 1, wherein the height at which the plurality of sacrificial fins are formed is about 60 nm to about 200 nm.

7. The method of claim 1, wherein the sacrificial fins comprise silicon.

8. The method of claim 1, wherein the first insulating layer comprises nitride.

9. The method of claim 1, further comprising planarizing top surfaces of the sacrificial fins and first insulating layer prior to the removing of a portion of each of the sacrificial fins.

10. The method of claim 1, wherein the removing of a portion of each of the sacrificial fins comprises selectively etching the sacrificial fins with respect to the first insulating layer.

11. The method of claim 1, wherein the height is reduced to about 5 nm to about 10 nm.

12. A method for manufacturing a semiconductor device, comprising:
    forming a plurality of silicon fins on a substrate, wherein the plurality of silicon fins are spaced apart from each other at a pitch and formed to a height in a direction perpendicular to a top surface of the substrate and to a width in a direction parallel to the top surface of the substrate;
    forming a nitride layer between each of adjacent silicon fins and on lateral surfaces of each of the silicon fins;
    removing a portion of each of the silicon fins to reduce the height of the silicon fins to form a plurality of cavities in the nitride layer that are each partially filled with the remaining portion of each of the silicon fins, respectively;

epitaxially growing a silicon germanium (SiGe) layer on the remaining portion of each of the silicon fins in each of the plurality of cavities;

performing a top-down condensation process on the epitaxially grown SiGe layers to form an oxide layer and an SiGe fin under the oxide layer in place of each epitaxially grown SiGe layer and the remaining portion of each silicon fin;

wherein a width of each oxide layer and a width of the SiGe fin under each oxide layer are at least substantially the same as the width of the silicon fins, and each oxide layer is respectively located on a top surface of a corresponding SiGe fin without extending onto lateral surfaces of the corresponding SiGe fin; and removing each oxide layer and the nitride layer after performing the top-down condensation process;

wherein an insulating layer is positioned between the SiGe fins and the substrate; and wherein the nitride layer is removed down to a top surface of the insulating layer.

13. The method of claim 12, wherein the pitch is about 35 nm or less.

14. The method of claim 13, wherein a percentage of germanium in each SiGe fin is greater than or equal to 50 atomic percent.

15. The method of claim 14, wherein each SiGe fin has a height of about 30 nm to about 60 nm in the direction perpendicular to the top surface of the substrate.

16. The method of claim 14, wherein each SiGe fin is compressively strained.

17. The method of claim 12, wherein the removing of a portion of each of the silicon fins comprises selectively etching the silicon fins with respect to the nitride layer.

18. The method of claim 12, wherein the height is reduced to about 5 nm to about 10 nm.

19. The method of claim 12, wherein the height at which the plurality of silicon fins are formed is about 60 nm to about 200 nm.

20. The method of claim 12, further comprising planarizing top surfaces of the silicon fins and nitride layer prior to the removing of a portion of each of the silicon fins.

* * * * *